(12) United States Patent
Pedersen et al.

(10) Patent No.: US 10,546,076 B2
(45) Date of Patent: Jan. 28, 2020

(54) ANALYTICAL CONSISTENT SENSITIVITIES FOR EXTERNAL INTERVENING BETWEEN TWO SEQUENTIAL EQUILIBRIUMS

(71) Applicant: Dassault Systemes Simulia Corp., Johnston, RI (US)

(72) Inventors: Claus Bech Wittendorf Pedersen, Hamburg (DE); Vladimir Belsky, Johnston, RI (US); Kingshuk Bose, Johnston, RI (US)

(73) Assignee: Dassault Systemes Simulia Corp., Johnston, RI (US)

( * ) Notice: Subject to any disclaimer, the term of this patent is extended or adjusted under 35 U.S.C. 154(b) by 283 days.

(21) Appl. No.: 15/392,095

(22) Filed: Dec. 28, 2016

(65) Prior Publication Data

US 2018/0181691 A1 Jun. 28, 2018

(51) Int. Cl.
*G06F 17/50* (2006.01)
*G06F 17/11* (2006.01)

(52) U.S. Cl.
CPC .......... *G06F 17/5009* (2013.01); *G06F 17/11* (2013.01); *G06F 17/5018* (2013.01)

(58) Field of Classification Search
CPC ... G06F 17/5009; G06F 17/11; G06F 17/5018
USPC .......................................................... 703/2
See application file for complete search history.

(56) References Cited

U.S. PATENT DOCUMENTS

2016/0125107 A1* 5/2016 Druckman .......... G06F 17/5018
703/2

OTHER PUBLICATIONS

Chattopadhyay et al. "A Multidisciplinary Optimization Using Semi-Analytical Sensitivity Analysis Procedure and Multilevel Decomposition", 1995, Computers Math. Applic. vol. 29, No. 7, pp. 55-56. ("Chat") (Year: 1995).*
Fancello, E.A., "Topology Optimization for Minimum Mass Design Considering Local Failure Constraints and Contact Boundary Conditions", *Structural and Multidisciplinary Optimization*, 32:229-240. (2006).
Giusti, et al., "Topology Design of Elastic Structures for a Contact Model," *Lecture Notes in Computational Science and Engineering*, 101:203-220 (2014).

(Continued)

*Primary Examiner* — Kamini S Shah
*Assistant Examiner* — Faraj Ayoub
(74) *Attorney, Agent, or Firm* — Armstrong Teasdale LLP

(57) ABSTRACT

Embodiments provide methods and systems for optimizing a physical system. One such example embodiment begins by defining, in memory of a processor, a model comprising a plurality of design variables where the defined model represents a real-world physical system where behavior of the model is given by an equation that includes corresponding sensitivity equations for the plurality of design variables. The example method continues by iteratively optimizing the model with respect to a given design variable of the plurality, using the equation. In an example embodiment, the optimizing includes the processor accounting for a given external intervention event between equilibriums by adding a term for design response sensitivity of the given one of the plurality of design variables to the corresponding sensitivity equation of the given design variable. Such optimizing results in an improved optimization of the real-world physical model.

17 Claims, 13 Drawing Sheets

(56) References Cited

OTHER PUBLICATIONS

Hilding, D. and Klarbring, A., "Optimization of structures in frictional contact," *Comput. Methods Appl. Mech. Engrg.*, 205-208: 83-90 (2012).

Michaleris, P., et al., "Tangent Operators and Design Sensitivity Formulations for Transient Non-linear Coupled Problems with Applications to Elastoplasticity," *International Journal for Numerical Methods in Engineering*, 37:2471-2499 (1994).

Stromberg, N. and Klarbring A., "Topology optimization of structures in unilateral contact," *Structural and Multidisciplinary Optimization*, 41: 57-64 (2010).

Tortorelli, D. A. and Michaleris, P., "Design sensitivity analysis: Overview and review," *Inverse Problems in Engineering*, 1:71-105 (1994).

van Keulen, F., et al., "Review of Options for Structural Design Sensitivity Analysis. Part 1: Linear Systems," *Computer Methods in Applied Mechanics and Engineering*, 194:3213-3243 (2005).

Vidal, C. A. And Haber, R. B. "Design Sensitivity Analysis for Rate-independent Elastoplasticity," *Computer Methods in Applied Mechanics and Engineering*, 107:393-431 (1993).

\* cited by examiner $$\frac{d\{F\}_n}{d\phi_i} = \frac{\partial\{F\}_n}{\partial\phi_i} + \frac{\partial\{F\}_n}{\partial\{u\}_{F,n}} \frac{d\{u\}_{F,n}}{d\phi_i} + \frac{\partial\{F\}_n}{\partial\{u\}_{F,n-1}} \frac{d\{u\}_{F,n-1}}{d\phi_i} = \{0\}$$

$$\Downarrow$$

$$\boxed{\frac{d\{u\}_{F,n}}{d\phi_i}} = -\left[\frac{\partial\{F\}_n}{\partial\{u\}_{F,n}}\right]^{-1}\left(\frac{\partial\{F\}_n}{\partial\phi_i} + \frac{\partial\{F\}_n}{\partial\{u\}_{F,n-1}} \frac{d\{u\}_{F,n-1}}{d\phi_i}\right)$$

441a SUPPLEMENTARY TERMS

The design response $DRESP$ and the Lagrange multiplier:

$$DRESP = DRESP + \{\lambda\}^T(\{R(\{\varphi\},\{u\}_n,\{u\}_{n-1},\{P\}_n)\}) = DRESP + \begin{Bmatrix}\{\lambda\}_f \\ \{\lambda\}_F\end{Bmatrix}^T \begin{Bmatrix}\{R_f(\{\varphi\},\{u\}_n,\{u\}_{n-1},\{P\}_n)\}_n \\ \{R_F(\{\varphi\},\{u\}_n,\{u\}_{n-1},\{P\}_n,\{R_{reac}F,n\})\}_n\end{Bmatrix}$$

$$\frac{dDRESP}{d\varphi_j} = \frac{\partial DRESP}{\partial \varphi_j} + \frac{\partial DRESP}{\partial \{P\}_n}\frac{d\{P\}_n}{d\varphi_j} + \frac{\partial DRESP}{\partial \{R_{reac}F,n\}}\frac{d\{R_{reac}F,n\}}{d\varphi_j}$$

$$+ \begin{Bmatrix}\{\lambda\}_f \\ \{\lambda\}_F\end{Bmatrix}^T \begin{Bmatrix} \frac{\partial\{R\}_{f,n}}{\partial\varphi_j} + \frac{\partial\{R\}_{f,n}}{\partial\{P\}_n}\frac{d\{P\}_n}{d\varphi_j} + \frac{\partial\{R\}_{f,n}}{\partial\{u\}_{n-1}}\frac{d\{u\}_{n-1}}{d\varphi_j} + \frac{\partial\{R\}_{f,n}}{\partial\{u\}_{f,n}}\frac{d\{u\}_{f,n}}{d\varphi_j} + \frac{\partial\{R\}_{f,n}}{\partial\{u\}_{F,n}}\frac{d\{u\}_{F,n}}{d\varphi_j} \\ \frac{\partial\{R\}_{F,n}}{\partial\varphi_j} + \frac{\partial\{R\}_{F,n}}{\partial\{P\}_n}\frac{d\{P\}_n}{d\varphi_j} + \frac{\partial\{R\}_{F,n}}{\partial\{u\}_{n-1}}\frac{d\{u\}_{n-1}}{d\varphi_j} + \frac{\partial\{R\}_{F,n}}{\partial\{u\}_{f,n}}\frac{d\{u\}_{f,n}}{d\varphi_j} + \frac{\partial\{R\}_{F,n}}{\partial\{u\}_{F,n}}\frac{d\{u\}_{F,n}}{d\varphi_j} \end{Bmatrix}$$ — 442 where $\frac{d\{R_{reac}F,n\}}{d\varphi_j}$ is eliminated by:

$$\left(\frac{\partial DRESP}{\partial \{R_{reac}F,n\}} + \{\lambda\}_F^T \frac{\partial\{R\}_{F,n}}{\partial\{R_{reac}F,n\}}\right)\frac{d\{R_{reac}F,n\}}{d\varphi_j} = \{0\} \implies \{\lambda\}_F = -\left(\frac{\partial\{R\}_{F,n}}{\partial\{R_{reac}F,n\}}\right)^{-T}\left(\frac{\partial DRESP}{\partial\{R_{reac}F,n\}}\right)$$

where $\frac{d\{u\}_{f,n}}{d\varphi_j}$ is eliminated by:

$$\left(\frac{\partial DRESP}{\partial \{u\}_{f,n}} + \{\lambda\}_f^T \frac{\partial\{R\}_{f,n}}{\partial\{u\}_{f,n}} + \{\lambda\}_F^T \frac{\partial\{R\}_{F,n}}{\partial\{u\}_{f,n}}\right)\frac{d\{u\}_{f,n}}{d\varphi_j} = \{0\} \implies \{\lambda\}_f = -\left(\frac{\partial\{R\}_{f,n}}{\partial\{u\}_{f,n}}\right)^{-T}\left(\frac{\partial DRESP}{\partial\{u\}_{f,n}} - \left(\frac{\partial\{R\}_{F,n}}{\partial\{u\}_{f,n}}\right)^T\{\lambda\}_F\right)$$

Then the sensitivities of design response $DRESP$ with respect to the design variable $\varphi_j$ is determined by:

$$\frac{dDRESP}{d\varphi_j} = \frac{\partial DRESP}{\partial \varphi_j} + \frac{\partial DRESP}{\partial\{P\}_n}\frac{d\{P\}_n}{d\varphi_j} + \frac{\partial DRESP}{\partial\{u\}_{n-1}}\frac{d\{u\}_{n-1}}{d\varphi_j} \underbrace{- \frac{\partial DRESP}{\partial\{u\}_{f,n}}\left[\frac{\partial\{R\}_{f,n}}{\partial\{u\}_{f,n}}\right]^{-1}\left(\frac{\partial\{F\}_n}{\partial\varphi_j} + \frac{\partial\{F\}_n}{\partial\{u\}_{n-1}}\frac{d\{u\}_{n-1}}{d\varphi_j}\right)}_{441b}$$

$$+ \begin{Bmatrix}\{\lambda\}_f \\ \{\lambda\}_F\end{Bmatrix}^T \underbrace{\left(\left[\frac{\partial\{R\}_n}{\partial\varphi_j} + \frac{\partial\{R\}_n}{\partial\{u\}_{n-1}}\frac{d\{u\}_{n-1}}{d\varphi_j}\right] - \left(\frac{\partial\{F\}_n}{\partial\varphi_j} + \frac{\partial\{F\}_n}{\partial\{u\}_{n-1}}\frac{d\{u\}_{n-1}}{d\varphi_j}\right)\right)}_{\text{SUPPLEMENTARY TERMS}}$$

The sensitivities of design response $DRESP$ with respect to the design variable $\varphi_i$ is determined by:

$$\frac{dDRESP}{d\varphi_i} = \frac{\partial DRESP}{\partial \varphi_i} + \frac{\partial DRESP}{\partial \{P\}_n}\frac{d\{P\}_n}{d\varphi_i} + \frac{\partial DRESP}{\partial \{R_{reac}\}_{F,n}}\frac{d\{R_{reac}\}_{F,n}}{d\varphi_i} + \frac{\partial DRESP}{\partial \{u\}_{n-1}}\frac{d\{u\}_{n-1}}{d\varphi_i} + \frac{\partial DRESP}{\partial \{u\}_{f,n}}\frac{d\{u\}_{f,n}}{d\varphi_i} + \frac{\partial DRESP}{\partial \{u\}_{F,n}}\frac{d\{u\}_{F,n}}{d\varphi_i}$$

$$= \frac{\partial DRESP}{\partial \varphi_i} + \frac{\partial DRESP}{\partial \{P\}_n}\frac{d\{P\}_n}{d\varphi_i} + \frac{\partial DRESP}{\partial \{R_{reac}\}_{F,n}}\frac{d\{R_{reac}\}_{F,n}}{d\varphi_i} + \frac{\partial DRESP}{\partial \{u\}_{n-1}}\frac{d\{u\}_{n-1}}{d\varphi_i} + \frac{\partial DRESP}{\partial \{u\}_{f,n}}\frac{d\{u\}_{f,n}}{d\varphi_i} + \frac{\partial DRESP}{\partial \{u\}_{F,n}}\left(\left[\frac{\partial \{F\}_n}{\partial \{u\}_{F,n}}\right]^{-1}\left(\frac{\partial \{F\}_n}{\partial \varphi_i} + \frac{\partial \{F\}_n}{\partial \{u\}_{F,n-1}}\frac{d\{u\}_{F,n-1}}{d\varphi_i}\right)\right)$$ ⟵ 443

SUPPLEMENTARY TERMS — 441c

The residual:

$$\{R(\{\varphi\},\{u\}_n,\{u\}_{n-1},\{P\}_n,\{R_{reac}\}_{F,n})\}_n = \begin{Bmatrix}\{R_f(\{\varphi\},\{u\}_n,\{u\}_{n-1},\{P\}_n)\}_n \\ \{R_F(\{\varphi\},\{u\}_n,\{u\}_{n-1},\{P\}_n,\{R_{reac}\}_{F,n})\}_n\end{Bmatrix} = \begin{Bmatrix}\{0\} \\ \{0\}\end{Bmatrix}$$

where $\dfrac{d\{u\}_{f,n}}{d\varphi_i}$ is determined by:

$$\frac{\partial \{R\}_{f,n}}{\partial \varphi_i} = \frac{\partial \{R\}_{f,n}}{\partial \varphi_i} + \frac{\partial \{R\}_{f,n}}{\partial \{P\}_n}\frac{d\{P\}_n}{d\varphi_i} + \frac{\partial \{R\}_{f,n}}{\partial \{u\}_{n-1}}\frac{d\{u\}_{n-1}}{d\varphi_i} + \frac{\partial \{R\}_{f,n}}{\partial \{u\}_{f,n}}\frac{d\{u\}_{f,n}}{d\varphi_i} + \frac{\partial \{R\}_{f,n}}{\partial \{u\}_{F,n}}\frac{d\{u\}_{F,n}}{d\varphi_i} = \{0\}$$

$$\Longrightarrow \frac{\partial \{R\}_{f,n}}{\partial \varphi_i} = \frac{\partial \{R\}_{f,n}}{\partial \varphi_i} + \frac{\partial \{R\}_{f,n}}{\partial \{P\}_n}\frac{\partial \{P\}_n}{\partial \varphi_i} + \frac{\partial \{R\}_{f,n}}{\partial \{u\}_{n-1}}\frac{d\{u\}_{n-1}}{d\varphi_i} + \frac{\partial \{R\}_{f,n}}{\partial \{u\}_{f,n}}\frac{d\{u\}_{f,n}}{d\varphi_i} + \frac{\partial \{R\}_{f,n}}{\partial \{u\}_{F,n}}\left(\left[\frac{\partial \{F\}_n}{\partial \{u\}_{F,n}}\right]^{-1}\left(\frac{\partial \{F\}_n}{\partial \varphi_i} + \frac{\partial \{F\}_n}{\partial \{u\}_{F,n-1}}\frac{d\{u\}_{F,n-1}}{d\varphi_i}\right)\right)$$

where $\dfrac{d\{R_{reac}\}_{F,n}}{d\varphi_i}$ is determined by:

$$\frac{d\{R_{reac}\}_{F,n}}{d\varphi_i} = \frac{\partial \{R\}_{F,n}}{\partial \varphi_i} + \frac{\partial \{R\}_{F,n}}{\partial \{P\}_n}\frac{d\{P\}_n}{d\varphi_i} + \frac{\partial \{R\}_{F,n}}{\partial \{u\}_{n-1}}\frac{d\{u\}_{n-1}}{d\varphi_i} + \frac{\partial \{R\}_{F,n}}{\partial \{u\}_{f,n}}\frac{d\{u\}_{f,n}}{d\varphi_i} + \frac{\partial \{R\}_{F,n}}{\partial \{u\}_{F,n}}\frac{d\{u\}_{F,n}}{d\varphi_i} - \frac{\partial \{R_{reac}\}_{F,n}}{\partial \{R_{reac}\}_{F,n}}\frac{d\{R_{reac}\}_{F,n}}{d\varphi_i}$$

$$\Longrightarrow \frac{d\{R_{reac}\}_{F,n}}{d\varphi_i} = \frac{\partial \{R\}_{F,n}}{\partial \varphi_i} + \frac{\partial \{R\}_{F,n}}{\partial \{P\}_n}\frac{d\{P\}_n}{d\varphi_i} + \frac{\partial \{R\}_{F,n}}{\partial \{u\}_{n-1}}\frac{d\{u\}_{n-1}}{d\varphi_i} + \frac{\partial \{R\}_{F,n}}{\partial \{u\}_{f,n}}\frac{d\{u\}_{f,n}}{d\varphi_i} + \frac{\partial \{R\}_{F,n}}{\partial \{u\}_{F,n}}\left(\left[\frac{\partial \{F\}_n}{\partial \{u\}_{F,n}}\right]^{-1}\left(\frac{\partial \{F\}_n}{\partial \varphi_i} + \frac{\partial \{F\}_n}{\partial \{u\}_{F,n-1}}\frac{d\{u\}_{F,n-1}}{d\varphi_i}\right)\right)$$

FIG. 4C

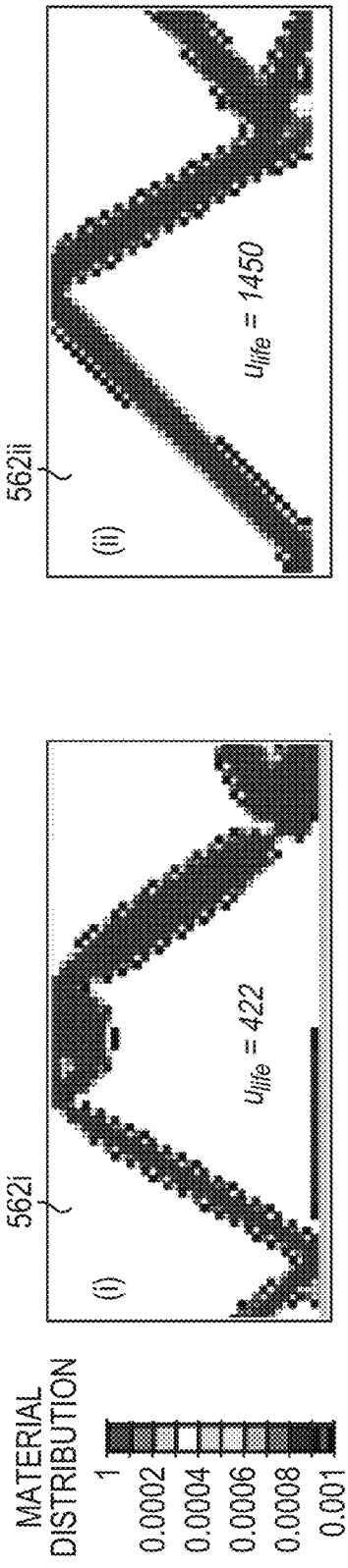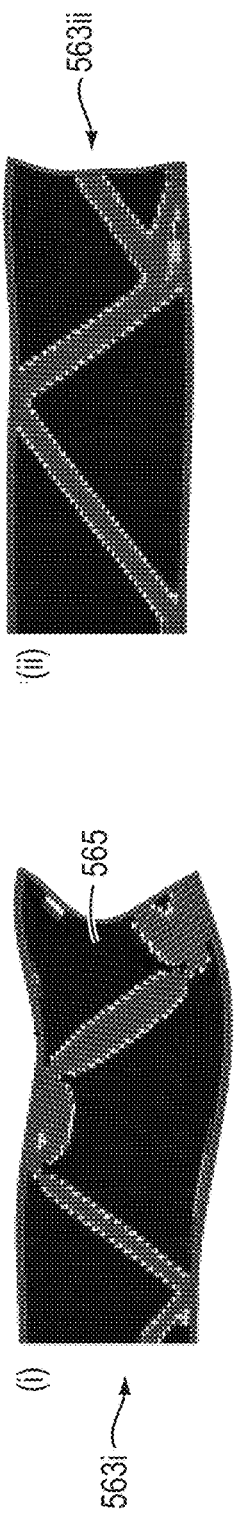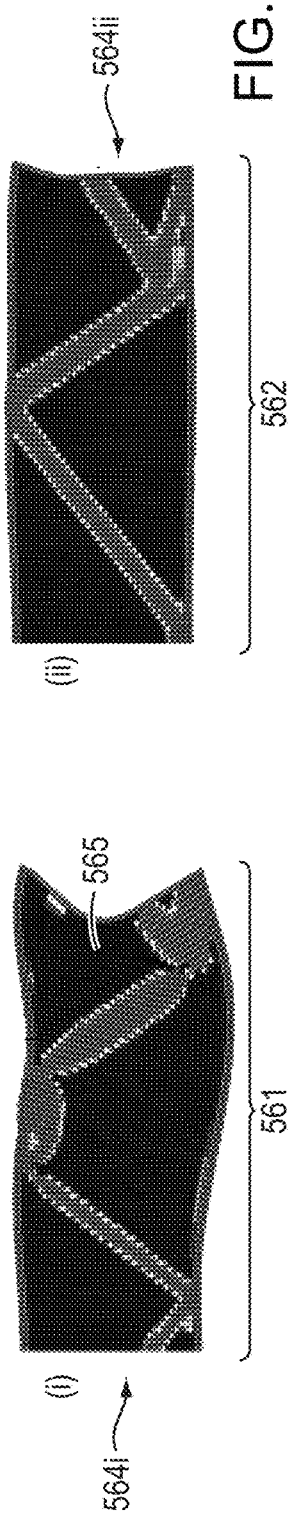
FIG. 5B

ANALYTICAL CONSISTENT SENSITIVITIES FOR EXTERNAL INTERVENING BETWEEN TWO SEQUENTIAL EQUILIBRIUMS

BACKGROUND

Embodiments of the invention generally relate to the field of computer programs and systems, and specifically, to the field of computer aided design (CAD), computer-aided engineering (CAE), modeling, simulation, and optimization.

A number of systems and programs are offered on the market for the design of parts or assemblies of parts. These so called CAD systems allow a user to construct and manipulate complex three-dimensional models of objects or assemblies of objects. CAD systems thus provide a representation of modeled objects using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometries, and representations may be stored in a single CAD file or multiple CAD files. CAD systems include graphic tools for representing the modeled objects to the designers; these tools are dedicated to the display of complex objects. For example, an assembly may contain thousands of parts. A CAD system can be used to manage models of objects, which are stored in electronic files.

The advent of CAD and CAE systems allows for a wide range of representation possibilities for objects. One such representation is a finite element model (FEM). The terms finite element analysis (FEA) model, FEM, finite element mesh, and mesh are used interchangeably herein. A FEM typically represents a CAD model, and thus, may represent one or more parts or an entire assembly. A FEM is a system of points called nodes which are interconnected to make a grid, referred to as a mesh.

The FEM may be programmed in such a way that the FEM has the properties of the underlying object or objects that it represents. When a FEM, or other such CAD or CAE model is programmed in such a way, it may be used to perform simulations of the object that it represents. For example, a FEM may be used to represent the interior cavity of a vehicle, the acoustic fluid surrounding a structure, and any number of real-world objects and systems. When a given model represents an object and is programmed accordingly, it may be used to simulate the real-world object itself. For example, a FEM representing a stent may be used to simulate the use of the stent in a real-life medical setting.

Likewise, CAD, CAE, and FEM models may be used to improve the design of the objects that the models represent. These design improvements may be identified through use of optimization techniques that run a series of simulations in order to identify changes to improve the design of the model and thus, the underlying object that the model represents.

SUMMARY OF THE INVENTION

While methods exist for optimization and simulation, these existing methods can benefit from functionality improving their computational efficiency and thus, embodiments of the claimed invention provide improvements to automated product designing based upon optimization and simulation.

One such example embodiment provides a computer implemented method of optimizing a physical system that begins by defining, in memory, a model that comprises a plurality of design variables and represents a real-world physical system. According to such an embodiment, behavior of the model is given by an equation stored in the memory and the equation includes corresponding sensitivity equations for the plurality of design variables. Such an example method continues by iteratively optimizing the model with respect to a given one of the plurality of design variables using the equation, where the optimizing includes accounting for a given external intervention event between equilibriums by adding a term for design response sensitivity of the given design variable to the corresponding sensitivity equation of the given design variable. In this example embodiment, the iterative optimizing results in an improved optimization of the real-world physical model.

In an alternative embodiment of the method, iteratively optimizing the model further comprises modifying the model based upon the design response sensitivity of the given design variable, e.g., a sensitivity solution of the design response sensitivity of the given design variable. Further, in another example embodiment, modifying the model may include modifying the given design variable in a direction indicated by the solution of the design response sensitivity.

The plurality of design variables included in the model may be any such design variables known in the art. For instance, according to one example embodiment of the method, the design variable is at least one of: a dimension, a thickness, a width, a radius, a composite material angle, a sizing variable, a material interpolation variable for topology, a shape variable, and a bead variable. Likewise, according to an embodiment, the model may be iteratively optimized for a variety of responses, including at least one of a structural, a computational fluid dynamics (CFD), a thermo-mechanical, an electro-mechanical, an electromagnetic, an acoustic, and a fluid-structural response of the model. Further, in one such example embodiment, the iterative optimizing determines a parameter value for the given design variable.

In yet another embodiment of the method, adding the term for design response sensitivity to the corresponding sensitivity equation results in consistently including the external intervention event in the corresponding sensitivity equation of the given design variable for the iterative optimizing. In one such example embodiment, the term for design response sensitivity of the given design variable is added using an adjoint or direct method. Further, according to another embodiment, the equilibriums are sequential equilibriums of a respective optimization iteration.

An embodiment of the present invention is directed to a system, e.g. a computer based system, for optimizing a real-world physical system. Such a system comprises a processor and a memory with computer code instructions stored thereon, where the processor and the memory with the computer code instructions being configured to cause the system to implement the functionality for optimizing the real-world system according to any method described herein. For instance, in one example embodiment, the processor and the memory, with the computer code instructions, cause the system to define, in the memory, a model comprising a plurality of design variables, the defined model represents a real-world physical system where behavior of the model is given by an equation stored in the memory, where the equation includes corresponding sensitivity equations for the plurality of design variables. Further, according to such an embodiment, the processor and the memory, with the computer code instructions, cause the system to iteratively optimize the model with respect to a given one of the plurality of design variables using the equation. In such an example embodiment, the optimizing includes the processor accounting for a given external intervention event between equilibriums by adding a term for design response sensitivity of the given one of the plurality of design variables to the corresponding sensitivity equation of the given design variable.

According to a further example embodiment of the system, in iteratively optimizing the model, the processor and the memory, with the computer code instructions, cause the system to modify the model based upon a sensitivity solution of the design response sensitivity of the given design variable. In yet another example embodiment, in the modifying the model, the processor and the memory, with the computer code instructions, are further configured to cause the system to modify the given design variable in a direction indicated by the solution of the design response sensitivity. Further, in an example system embodiment, the iterative optimizing determines a parameter value for the given design variable.

As in the example embodiment of the method, in one such example embodiment of the system, the design variable is at least one of: a dimension, a thickness, a width, a radius, a composite material angle, a sizing variable, a material interpolation variable for topology, a shape variable, and a bead variable. Further, in an example embodiment of the system, iteratively optimizing the model optimizes at least one of: a structural, a CFD, a thermo-mechanical, an electro-mechanical, an electromagnetic, an acoustic, and a fluid-structural response of the model.

According to embodiment of the system, the adding results in consistently including the external intervention event in the corresponding sensitivity equation of the given design variable for the iterative optimizing. In yet another example embodiment of the system, the equilibriums are sequential equilibriums of a respective optimization iteration with the external intervention event between them. Further, in an embodiment, the system is configured so as to add the term for design response sensitivity of the given design variable using an adjoint or a direct method.

Yet another embodiment of the present invention is directed to a cloud computing implementation for optimizing a model. Such an embodiment is directed to a computer program product executed by a server in communication across a network with one or more clients. In such an embodiment, the computer program product comprises a computer readable medium which comprises program instructions, which, when executed by a processor, causes the processor to define, in memory of the processor, a model comprising a plurality of design variables, the defined model representing a real-world physical system where behavior of the model is given by an equation stored in the memory, where the equation includes corresponding sensitivity equations for the plurality of design variables. Moreover, in such an embodiment, the program instructions, when executed, further cause the processor to iteratively optimize the model with respect to a given one of the plurality of design variables using the equation, where the optimizing includes the processor accounting for a given external intervention event between equilibriums by adding a term for design response sensitivity of the given one of the plurality of design variables to the corresponding sensitivity equation of the given design variable.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 4A-4C depict computational methods that may be utilized in example embodiments.

FIG. 5B depicts optimized topologies.

DETAILED DESCRIPTION OF THE INVENTION

Figure 1:
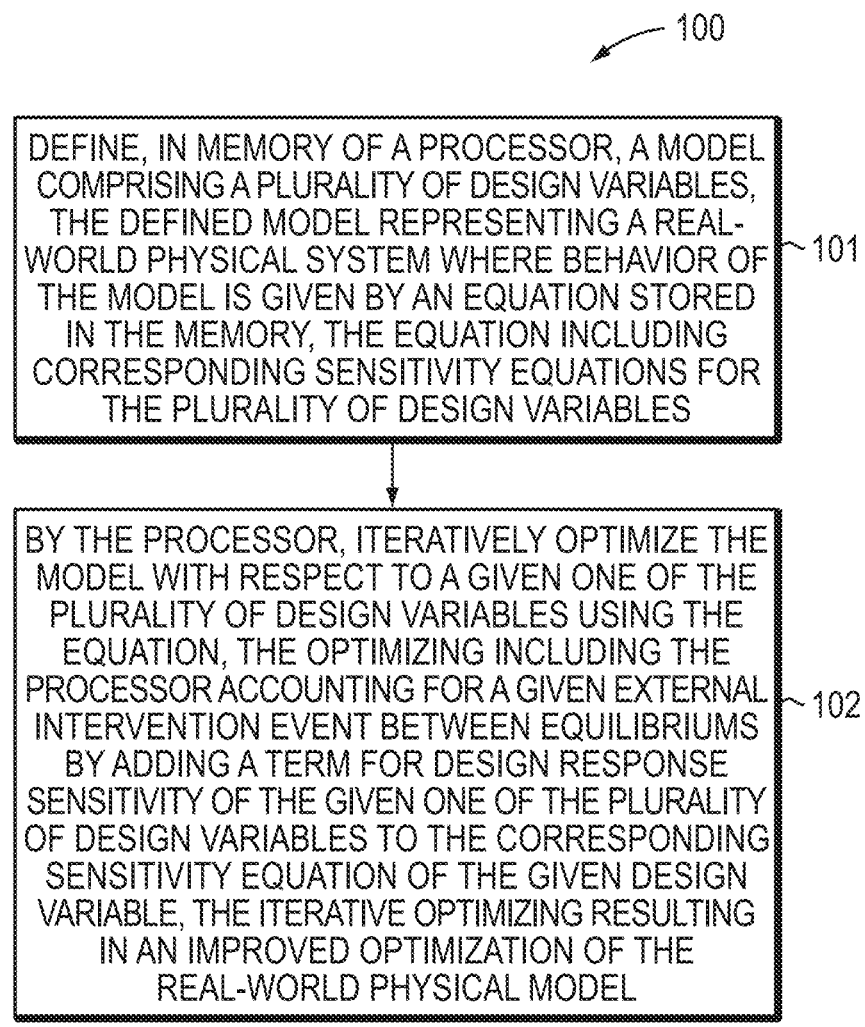
FIG. 1 is a flowchart depicting a method of optimizing a physical system according to one example embodiment.

A description of example embodiments of the invention follows.

The teachings of all patents, published applications and references cited herein are incorporated by reference in their entirety.

The term "sensitivities" is used herein, however, it is noted that sensitivities are mathematically equivalent to derivatives and the term sensitivities is commonly used in structural and multidisciplinary optimization.

In recent years, design processes have transformed from being a trial and error design process to modern design processes which include the introduction of simulations early in the design processes and further, the introduction of automated optimization. Frequently, existing automated optimization methods use analytical or semi-analytical sensitivities. However, existing methods have problems with low to medium intervening between equilibriums and thus, such methods require a higher number of optimization iterations. Likewise, optimizations with medium to high medium intervening between equilibriums typically diverge. The inventors have determined that these problems are caused by not appropriately accounting for the impact of the external intervening between two equilibriums in the analytical sensitivities and thus, embodiments of the present invention are directed to solving these problems.

Not accounting for the intervening is particularly troublesome in the automotive and aerospace industries where use of sensitivity based optimization for structural parts assembled by bolts and fasteners with preloading is extensive. In such cases, the preloading can give rise to a significant external intervening and thereby, significantly influence the results of the analytical or semi-analytical sensitivities and the overall design process.

Embodiments of the present invention utilize models to provide methods and systems for automated product design based upon optimization and simulation. Methods exist for simulating variations of parameters of these models, which are often referred to as sensitivity simulations and likewise, methods exist for determining optimized variations of the model parameters. Such simulation and optimization methods can identify and determine, for example, behavior of the model with different values for parameters. In the case of optimization, optimal values for these parameters can be determined through performance of optimization methods, i.e., mathematical programming, that includes sensitivity simulations. However, methods do not exist for analytical or semi-analytical sensitivity solutions where one or several external intervening events occur between two sequential equilibriums. Likewise, there is no known consistent and rigorous methodology for determining sensitivity solutions for a simulation/optimization scenario where an intervening event occurs between equilibriums.

For optimization methods that are based upon sensitivities as input for mathematical programming, e.g., the computational methods used to perform the optimization, it is best for the sensitivities to be correct both numerically and mathematically. When performing an optimization, the optimization convergence is slower and the computational costs are higher if the external interventions are not consistently included in the analytical sensitivity calculations. Moreover, strong external interventions between two sequential equilibriums can yield a very slow optimization convergence, or even divergence. In such scenarios, no optimization solution is obtained if the external intervening is not mathematically and consistently included in the calculation of the analytical sensitivities or, at best, a solution is obtained through significant computational costs.

Embodiments of the present invention overcome the foregoing deficiencies and provide methods and systems that can be used to perform optimizations and simulations with external interventions. For instance, embodiments can be used for structural optimization disciplines, such as topology optimization, shape optimization, sizing optimization, and bead optimization. Further, it is noted that, embodiments of the present invention are not in any way limited to structural analytical optimization disciplines and can also be used for multiphysics optimizations such as computational fluid dynamics, thermo-mechanical, electro-mechanical, fluid-structure, electromagnetic, and acoustic optimization.

FIG. 1 depicts an example embodiment of a method 100 for optimizing a physical system according to the principles of the present invention. The method 100 begins at step 101 by defining, in memory of a processor, a model comprising a plurality of design variables. In the method 100, the model defined at step 101 represents a real-world physical system and behavior of the model is given by an equation stored in the memory where the equation includes sensitivity equations corresponding to the plurality of design variables. Thus, defining the model at step 101 may include defining the equation and terms of the equation such that the equation, for example, if solved, can yield a result that describes behavior of the model. To illustrate, in an example embodiment where the physical system is an airplane, the equation would describe the flight of the plane under various operating conditions, such as the speed and elevation the plane could achieve under various operating conditions and the stresses and forces on the plane under those conditions. As is known to those of skill in the art, defining the model 101 may include defining these operating conditions so as to facilitate the method 100 optimizing the model of the plane under operating conditions of interest. The method 100 further requires that the equation include corresponding sensitivity equations for the plurality of the design variables. Thus, in an example embodiment, the equation may include a corresponding sensitivity equation for each design variable. Further, in an alternative embodiment, multiple sensitivity equations are included for one or more design variable. Further still, in yet another embodiment, sensitivity equations are not included for each design variable, and instead sensitivity equations are only included for design variables of interest.

According to an embodiment of the method 100, the model may be defined at step 101 according to any method known in the art. Further, while the model is described as representing a real-world physical system, the method 100 is not so limited, and the defined model may represent any system, whether real or contemplated, where an optimized design of the system is desired. Example systems include vehicles, buildings, medical devices, sports equipment, airplanes, military weapons, etc. In an embodiment, the model may be any computer based model, e.g. a CAD model or finite element model known in the art. Likewise, the design variables may be any design variables that can be associated with the physical system that the model represents. Example design variables include, but are not limited to: a dimension, a thickness, a width, a radius, a composite material angle, a sizing variable, a material interpolation variable for topology, a shape variable, and a bead variable.

At step 101, according to a computer implemented embodiment of the method 100, the memory is any memory communicatively coupled or capable of being communicatively coupled to the computing device performing the method 100. Likewise, the processor is any processor known in the art and may also include any number of processors in a distributed computing arrangement.

To illustrate the step 101, consider a simplified example where a suspension bridge is being designed and the method 100 is used to optimize the design of the bridge. At step 101, a finite element model is defined, in memory, that reflects all of the properties of the bridge, e.g., the dimensions, materials, and structure of the bridge, etc. and the model includes several design variables, e.g., cable length and cable thickness. Further, the behavior of the bridge is governed by an equation, known in the art, and this equation includes a respective sensitivity equation for cable length and cable thickness.

The method 100 continues at step 102 by the processor, iteratively optimizing the model defined at step 101, with respect to a given one of the plurality of design variables using the equation. The iterative optimizing at step 102 includes the processor accounting for a given external intervention event between equilibriums by adding a term for design response sensitivity of the given one of the plurality of design variables to the corresponding sensitivity equation of the given design variable. According to an embodiment, adding the term for design response sensitivity of the given design variable is performed using an adjoint or a direct method. Further, the term may be added as described herein below in relation to FIGS. 4A-4C. In an example embodiment, the iterative optimizing at step 102 may be performed using mathematical programming, e.g., optimization computations, techniques, and methods that are known in the art, that are modified so as to account for the external intervention as described herein. Thus, embodiments may utilize an existing software suite for performing optimization but modify the methodology so as to conform to the methods and systems described herein.

Step 102 accounts for the external intervention event between equilibriums. As is known in the art, optimization methods are performed iteratively, i.e., small changes are made to a model (e.g., design variables are modified) for a given iteration, and it is determined whether behavior of the model complies with desired specifications. For the method 100, at a step 102, in a given iteration, behavior of the model is determined in steps, where at various steps an equilibrium is reached. Unlike existing methods that cannot account for the intervention, by adding the term, as described herein, the method 100 accounts for an intervening event and thus, the method 100, provides an optimization method that can properly and efficiently optimize the model when an external event occurs between equilibriums of an optimization iteration.

According to an embodiment, at step 102, the term is added to the sensitivity equation of the design variable of interest. Further, the method 100 is not limited to optimizing the model with respect to a single design variable, and in an embodiment, the method 100 may optimize the model with regard to a plurality of design variables. In such an embodiment, a respective term is added to each respective design response sensitivity equation for each variable of interest. For example, if the design variables of interest are material thickness and material density, a term for design response sensitivity of material thickness would be added to the thickness sensitivity equation and a term for design response sensitivity of the material density would be added to the density sensitivity equation.

Embodiments of the method 100, may account for any intervention event between equilibriums as is known in the art. Example intervention events include components used in assembling with preloading and likewise, components that cause new fixed interfaces such as bolts and other similar assembly mechanisms. Other example intervention events include flexible mechanisms that get fixed at some interfaces during use. According to an embodiment, the equilibriums are sequential equilibriums of a respective optimization iteration. Further, in an embodiment of the method 100, the adding results in consistently including the external intervention event in the corresponding sensitivity equation of the given design variable for the iterative optimizing. Through adding the term to the design response sensitivity for the given design variable at step 102, the method 100 results in an improved optimization of the real-world physical model. In an embodiment, this optimization is improved in terms of computational efficiency and accuracy over prior art methods.

According to an embodiment of the method 100, optimizing the model at step 102 includes modifying the model based upon a sensitivity solution of the design response sensitivity of the given design variable. For instance, in an example, the sensitivity solution may indicate that increasing the value of the given design variable would allow the optimization to move closer to achieving desired performance and thus, the optimization would modify the design variable as such when performing the iterative optimization at step 102. Thus, such a modification may include modifying the given design variable in a direction indicated by the solution of the design response sensitivity. Likewise, the iterative optimizing at step 102 may determine a parameter value for the given design variable.

To illustrate step 102, consider the aforementioned bridge example where the design variable of interest is cable thickness. In this example embodiment of the method 100, it is desired to optimize cable thickness (i.e., minimize) while still allowing the bridge to conform to a load standard. In such an example, the bridge model defined at step 101 is used in an iterative optimization, where in a given iteration, the bridge is experiencing a first load and is at a first equilibrium and further, the bridge reaches a subsequent equilibrium, under a greater load. In this example, in between these equilibriums, e.g., as loading is increasing when reaching the second equilibrium, the bridge contacts an additional support. The method 100 can be used to optimize the model of the bridge under these conditions. To perform this optimization, where for example cable thickness is minimized, the bridge is iteratively optimized, e.g., the equation of the bridge is used in mathematical programming, to determine a minimum cable thickness, under the operating conditions (which include external intervening) where this solving is performed by adding a term for design response sensitivity of cable thickness to the sensitivity equation of the cable thickness.

Figure 2:
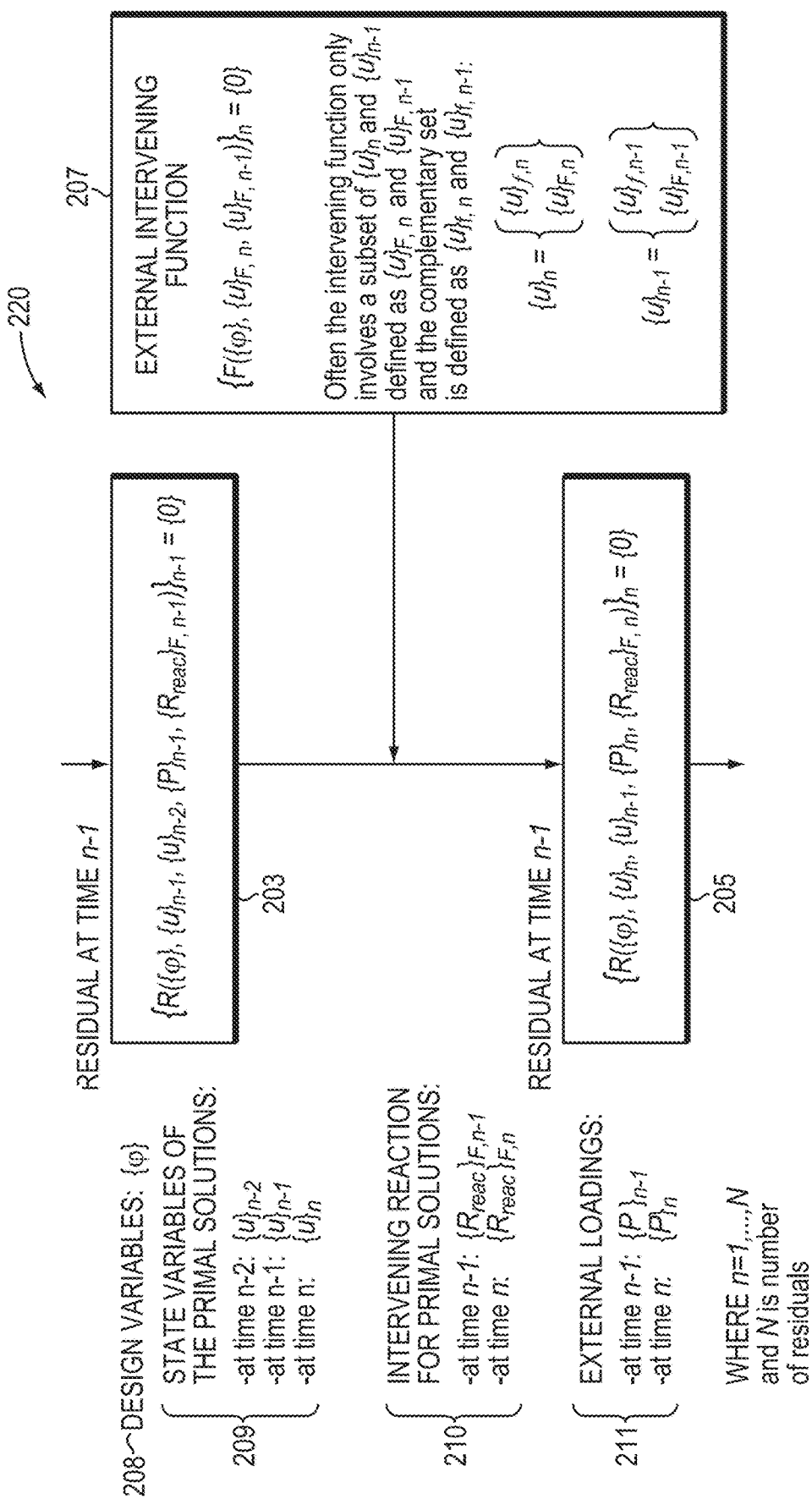
FIG. 2 depicts a method of optimizing a model that is implemented by an example embodiment.

As described herein, embodiments of the present invention provide optimization methods that account for external intervening. FIG. 2 depicts a method 220 that provides such functionality through deriving analytically consistent sensitivities of the external intervening 207 between the two sequential equilibriums 203 and 205. In the method 220, a system with design variables 208, state variables 209, and primal solution reactions 210, is optimized while subject to the external loading 211. In the method 220, the model reaches a first equilibrium 203 and a second equilibrium 205 where the external intervening 207 occurs between the equilibriums 203 and 205. By utilizing the principles described herein to account for sensitivities, the method 220 achieves a more computationally efficient and accurate optimization of the model. Unlike the sensitivity method 220 which consistently includes the external intervention event, existing methods do not find sensitivity solutions where the external intervening (207) between two sequential equilibriums (203 and 205) is added, as in the method 220.

Analytical sensitivity solutions, like those presented herein, e.g. the methods 100 and 220, are favored for industrial optimization when possible compared to strictly numerical sensitivities, such as total finite difference. This is generally the case because analytical sensitivities are more accurate and significantly more computationally efficient to calculate as compared to numerical sensitivities. Embodiments of the present invention can be used to extend existing analytical sensitivity methods, such as those described in (1) Tortorelli, D. A. and Michaleris, P., Design sensitivity analysis: Overview and review, Inverse Problems in Engineering 1: 71-105 (1994); (2) Kleiber, M., Antunez, H., Hien, T. D. and Kowalczyk, P., Parameter Sensitivity in Nonlinear Mechanics, Theory and Finite Element Computations, John Wiley and Sons (1997); (3) Michaleris, P., Tortorelli, D. A. and Vidal, C. A., Tangent Operators and Design Sensitivity Formulations for Transient Non-linear Coupled Problems with Applications to Elastoplasticity, International Journal for Numerical Methods in Engineering 37: 2471-2499 (1994); (4) Vidal, C. A. and Haber, R. B., Design Sensitivity Analysis for Rate-independent Elastoplasticity, Computer Methods in Applied Mechanics and Engineering 107: 393-431 (1993); (5) van Keulen, F., Haftka, R. T. and Kim, N. H., Review of Options for Structural Design Sensitivity Analysis. Part 1: Linear Systems, Computer Methods in Applied Mechanics and Engineering, 194: 3213-3243 (2005); (6) Choi, K. K. and Kim, N. H., Structural Sensitivity Analysis and Optimization 1: Linear Systems, Springer-Verlag New York Inc. (2005); and (7) Choi, K. K. and Kim, N. H., Structural Sensitivity Analysis and Optimization 2: Nonlinear Systems and Applications, Springer-Verlag New York Inc. (2005). Specifically, these existing methods include the adjoint method, direct method, and semi-analytical method which can be modified and/or utilized as described herein to account for external intervening between equilibriums of an optimization iteration. Further, embodiments of the present invention are not limited to these aforementioned numerical and logical methods for analytical sensitivities. Herein, these categorized methods are referred to as "analytical sensitivities."

As noted hereinabove, embodiments of the present invention can be used in a multitude of optimization tasks. Occasionally, the primal solution, for example, in the case of structural analysis, is divided into "free displacements" and "constrained displacements" which are enforced using boundary conditions of a given equilibrium. Thereby, the "constrained displacements" are considered design independent when deriving the analytical sensitivities. Embodiments of the present invention make no distinction between "free displacements" and "constrained displacements" without any loss of generality. Further, the generality of embodiments described herein holds for a variety of multiphysics disciplines.

Figure 3A:
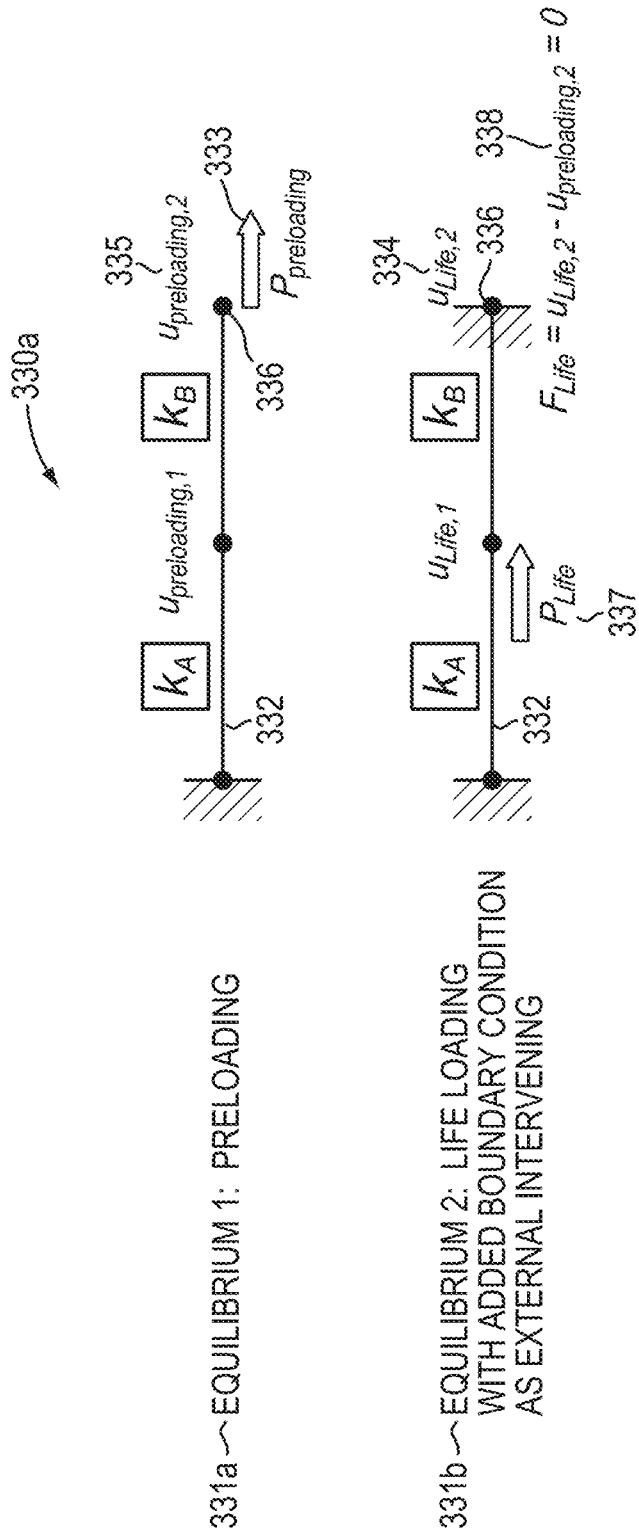
FIG. 3A illustrates stages of optimizing a model using methods of an embodiment.
Figure 3B:
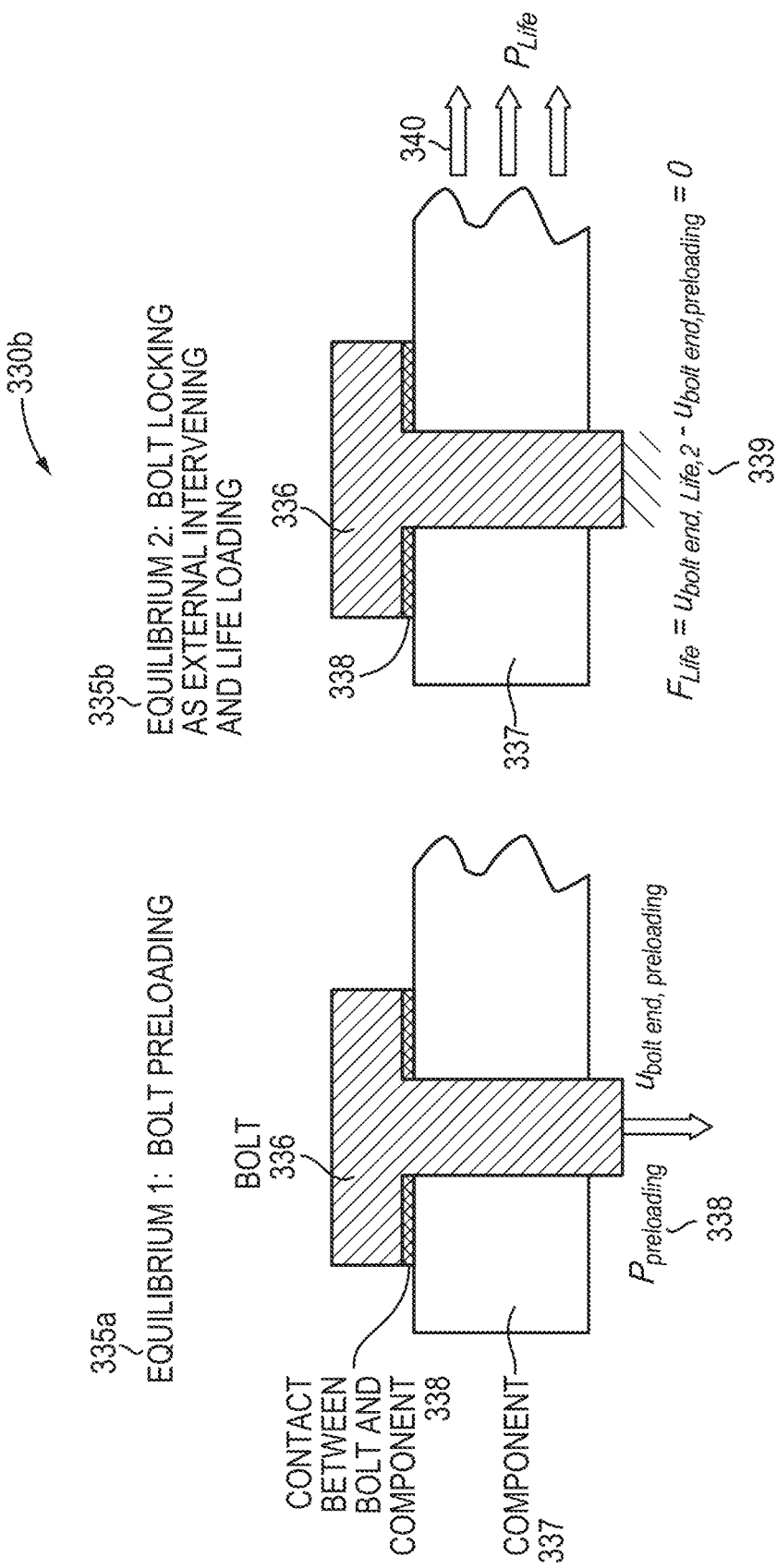
FIG. 3B illustrates two equilibriums of a model during an optimization method carried out according to principles of the present invention.

FIGS. 3A and 3B depict two structural examples 330a and 330b of systems with external intervening between two sequential equilibriums that may be optimized utilizing principles described herein. FIG. 3A depicts a two bar system 330a that includes the double bar 332 where for the first equilibrium 331a the model 332 is subjected to preloading 333. Subsequently, the external intervening is activated by fixing the displacement of $u_{life2}$ 334 to the displacement value, $u_{preloading2}$ 335, of the bar 332 at the end of the first equilibrium 331a. Thereby, the external intervening enforces the displacement of the end 336 of the bar 332 to be the same in both the first equilibrium 331a and second equilibrium 331b. After enforcing the displacement as described, the final primal solutions for the displacements of the model 332 are determined by the second equilibrium 331b where the structure 332 is subjected to the life load $P_{life}$ 337 as defined 338.

FIG. 3B illustrates a typical industrial structural system 330b of external intervening which may be optimized using principles of the present invention. In the system 330b, a component 337 is being assembled with, and contacts 338 the bolt 336. Further, in the system 330b, the bolt 336 is subjected to preloading 338 $P_{preloading}$ during the assembly process and then locked in that position $u_{preloading}$ during subsequent life loading 340, which is defined 339 as:

$$F_{life} = u_{bolt\ end\ life} - u_{bolt\ end\ preloading}$$

In the system 330b the external intervening occurs in the form of locking some of the bolt displacements of the first equilibrium 335a for the subsequent equilibrium 335b. Thereby, the external intervening is transferring the deformed bolt displacements for specific locations of the first equilibrium 335a into locking the displacements of the second equilibrium 335b, or any additional equilibriums that follow. This ensures that the corresponding displacements of the first equilibrium 335a are maintained for the specific bolt locations.

As noted hereinabove, prior art methods for determining analytical sensitivities do not outline any solutions for consistently including external intervening. In contrast, embodiments of the present invention, when used in systems such as the system 330b where the intervening includes the bolt 336 being locked in the second equilibrium 335b, can consistently include such external intervening for the analytical sensitivities. Thus, through use of the principles of the present invention described herein, optimization based upon analytical sensitivities, such as for the systems 330a and 330b of FIGS. 3A and 3B, respectively, would yield a faster optimization iteration solution by reducing the number of optimization iterations. Likewise, by implementing the principles of the present invention in an optimization of the systems 330a and 330b a more correct design result is determined because, through use of the principles described herein, the analytical sensitivities are both numerically more accurate and analytically exact.

FIGS. 4A-4C depict a mathematical method of accounting for external intervening that may be implemented in any embodiments of the present invention described herein. For example, when optimizing a model as depicted in FIG. 2, such an embodiment can utilize the methodologies of FIGS. 4A-4C to include the sensitivities of the intervening function $\{F\}_n$, such as the function 207, between two equilibriums, such as the equilibriums 203 and 205 for analytical sensitivities of the subsequent equilibrium, e.g. 205, as derived in FIGS. 4A-4C with respect to a given design variable $\varphi_i$. In this way, embodiments can account for the external intervening between equilibriums.

FIG. 4A illustrates the aforementioned derivation 440 of the external intervening function, e.g. 207. This derivation 440 yields the supplementary terms 441a, i.e., the derivative of the external intervening function, which during iterative optimization, can be added to the corresponding sensitivity equation of the given design variable $\varphi_i$ to account for the external intervening. Thus, the derivative of the external intervening function in FIG. 4A is included in the analytical sensitivities for a given design response (DRESP) of an equilibrium n with respect to a given design variable $\varphi_i$.

FIG. 4B depicts operations that may be performed in embodiments of the present invention through any combination of software programming and hardware devices, to include the supplementary sensitivity terms, which can be the terms 441a of the intervening function as derived in FIG. 4A, in the analytical sensitivities derived using the so-called adjoint sensitivity method for a given design variable $\varphi_i$. In FIG. 4B the operations 442 provide a method to utilize the supplementary terms 441b to consistently include the external intervention event in the sensitivity equation of the given design variable $\varphi_i$.

FIG. 4C depicts alternative operations 443, that may be employed in embodiments of the present invention for deriving the analytical sensitivities for a given DRESP of equilibrium n with respect to a given design variable $\varphi_i$. The operations 443 depict how the supplementary sensitivity terms 441c of the intervening function defined in FIG. 4A are included in the analytical sensitivities using the direct sensitivity method.

FIGS. 4B and 4C show that inclusion of the supplementary sensitivity terms, generally 441, for the external intervening functions in-between equilibriums yields correct and consistent sensitivities for the DRESPs of equilibrium n. In FIGS. 4B and 4C the analytical sensitivities are included using the adjoint method or the direct method, respectively. However, embodiments of the present invention are not limited to consistently including the supplementary sensitivity term 441a of FIG. 4A for the external intervening function in-between two equilibriums for the analytical sensitivities for the DRESPs of an equilibrium n using the adjoint or direct method. The term $$\frac{d\{u\}_{n-1}}{d\{\varphi\}}$$

and thereby, terms $$\frac{d\{u\}_{f,n-1}}{d\{\varphi\}} \text{ and } \frac{d\{u\}_{F,n-1}}{d\{\varphi\}}$$

which are used in the supplementary terms 441, are determined using the adjoint method and direct method as shown in FIG. 4B and FIG. 4C. However, similar numerical and analytical methods for analytical sensitivities can also be used by indexing one back in the indexes of the equations where the initial start conditions are $$\frac{d\{u\}_0}{d\{\varphi\}} = 0.$$

As described herein, embodiments of the present invention provide numerous benefits over existing optimization methods. Embodiments of the present invention achieve these advances through consistently and rigorously computing analytical sensitivities for external intervening between two sequential equilibriums for optimization based upon mathematical programming. Advances of the present invention include better optimization convergence. Existing methods that include only inadequate sensitivities often lead to oscillations in the optimization convergence or even divergence of the optimization. Further, embodiments of the present invention provide better performance by achieving convergence in fewer optimization iterations. Moreover, embodiments determine the correct optimization of the objective function which yields better properties of component design and likewise, make it is easier to fulfill design constraints for the component design.

Figure 5A:
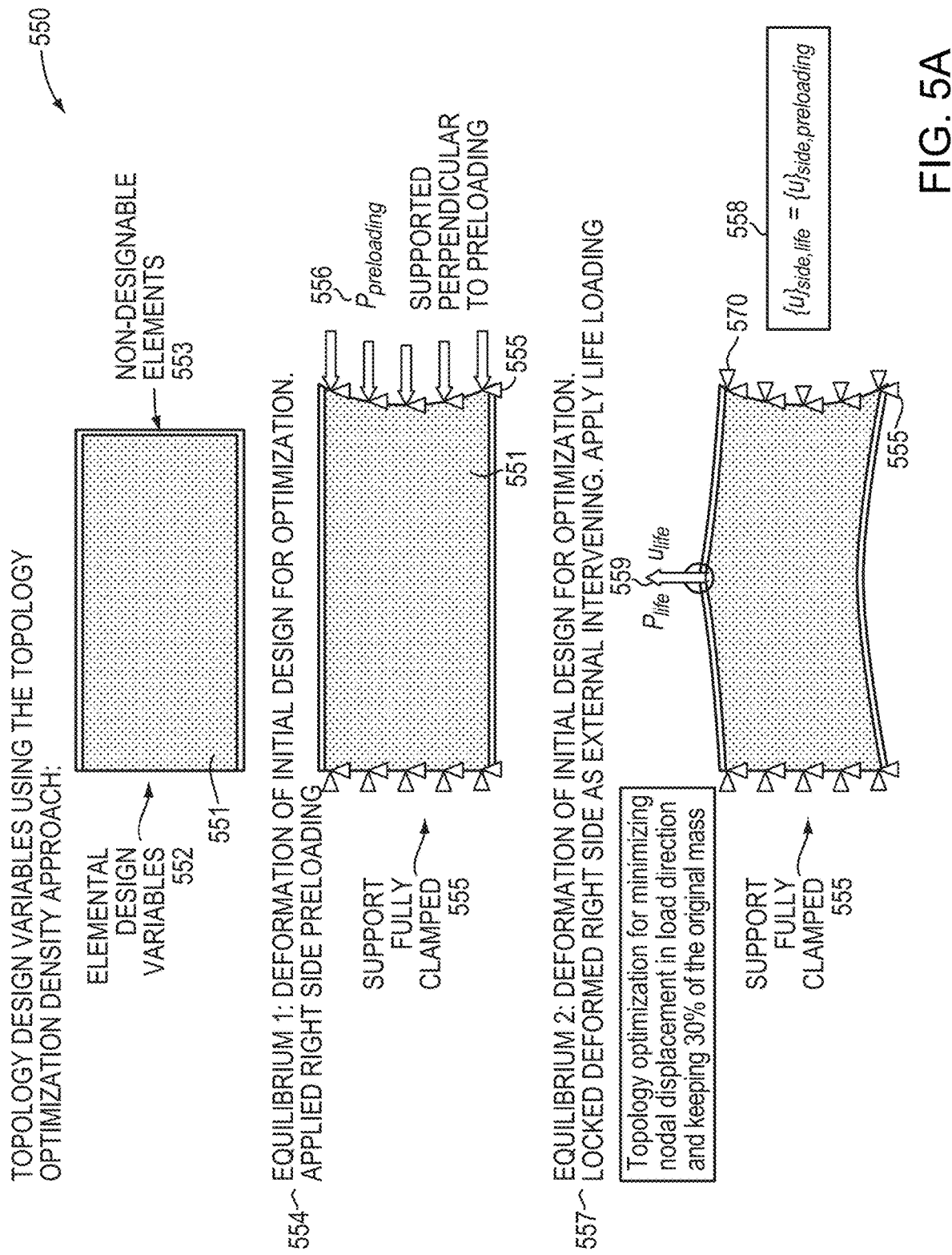
FIG. 5A depicts an example optimization method embodiment performed on a model.
Figure 5C:
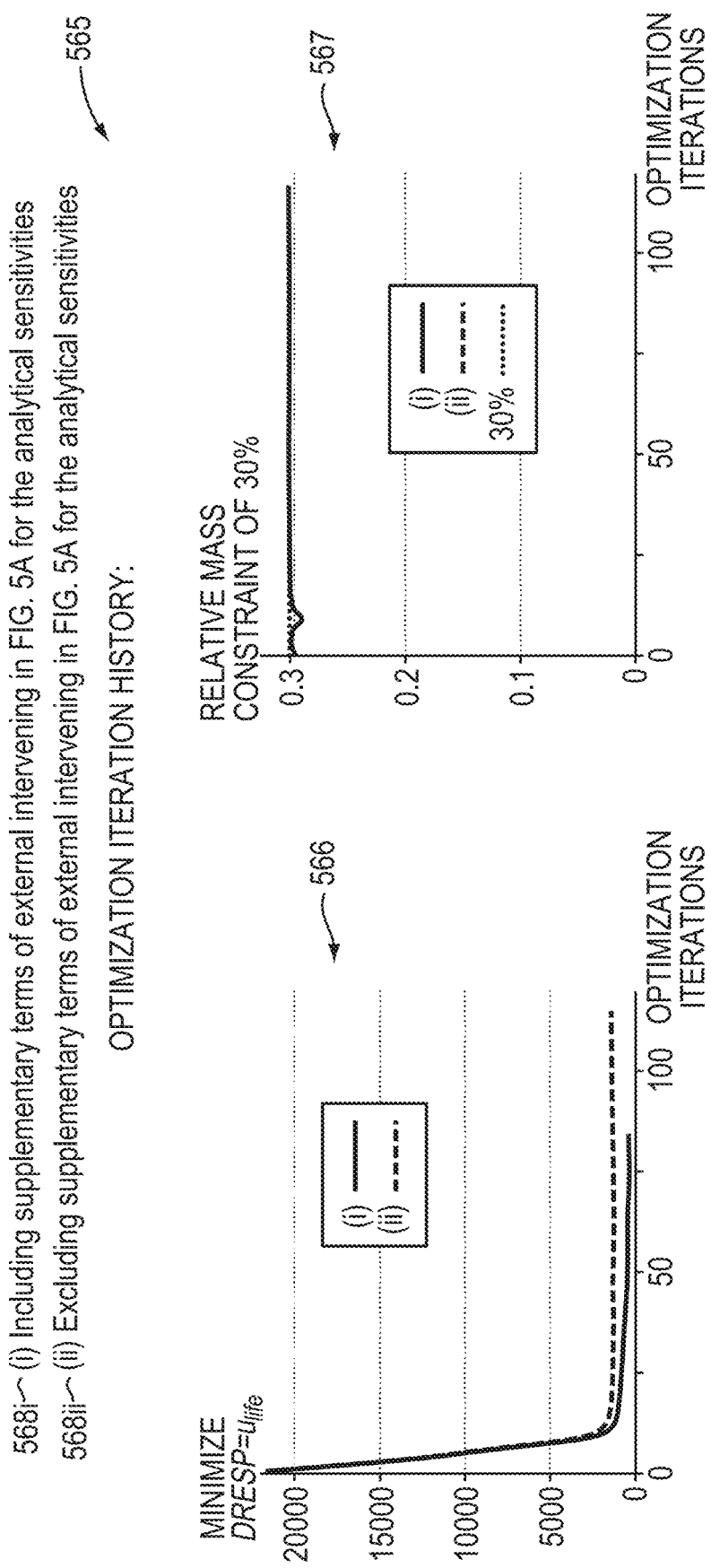
FIG. 5C are graphs illustrating optimization history.

FIGS. 5A-5C illustrate a practical example 550 for topology optimization for designing a structural component using two different approaches. The first optimization method uses a numerical implementation having consistently computed analytical sensitivities for external intervening between two sequential equilibriums, such as the methods described herein. The second approach optimizes the model with inconsistent analytical sensitivities, as the derivatives (sensitivities) of the external intervening are neglected. The final numerical results for the two different optimization methods are depicted in FIG. 5B and the optimization history of the two designs is shown in FIG. 5C.

FIG. 5A depicts a model 551 that is undergoing a topology optimization using a density approach. A background description of such an approach can be found in M. P. Bendsøe & O. Sigmund—Topology Optimization—Theory, Methods and Applications, 2004, the contents of which are herein incorporated by reference. The model 551 includes the elemental design variables 552 and non-designable elements 553. The objective of this example optimization 550 is to minimize the displacement where the concentrated life load 559 is applied, in the direction of this load for the second equilibrium 557. In the example 550, the topology optimization is constrained to be 30% of the full amount of material which the design elements 552 can contain when each element is filled up with material. The optimization 550 is executed using the method 660 of FIG. 6 described herein below in one instance. In another instance, the optimization is performed similarly to the method 660 with the exception that in the second instance, the optimization is performed using sensitivities without the contributions of the external intervening. The optimization is stopped when the convergence criteria for the change in objective is less than 0.1% and the change in design elements 552 is also less than 0.1%.

The finite element model 551 used in the optimization 550 comprises 3200 shell elements, such as Abaqus S4 shell elements, with a thickness of 0.05. The Young's modulus is 1.0 and the Poisson's ratio is 0.3 and linear finite element modeling is applied. In the optimization 550, the model 551 is subject to boundary conditions 555 and loading for pre-loading 556 of the equilibrium 554 and life loading 559 for the equilibrium 557. The preloading 556 is applied on the right side of the model 551 as a distributed shell-edge with a value of 1.1 and the life load 559 of the second equilibrium 557 is a concentrated force with a value of 6. Further, the external intervening for the optimization 550 is fixing 558 the deformed displacements 570 from the equilibrium 554 for the life load 559 of the second equilibrium 557.

Given the above conditions, a first optimization can be performed using the methods described herein, e.g. the methods 110 and/or 660, and for comparison, a second optimization can be performed that does not consider design response sensitivity of the external intervening 558. FIG. 5B shows the results 560 as the two optimized topologies 562i and 562ii where the results 561, shown in relation to reference numeral (i) correspond to the implementation having consistently computed analytical sensitivities for external intervening between two sequential equilibriums and the results 562, shown in relation to reference numeral (ii) correspond to the results achieved with an optimization implementation having inconsistent analytical sensitivities as the derivatives of the external intervening 558. In FIG. 5B it is clear to see that the two sets of results 561 and 562 are rather different. The results show very different material distributions 562i and 562ii in the optimized topologies and likewise have very different deformations 563i and 563ii for the first equilibrium 554 and different deformations 564i and 564ii for the second equilibrium 557. FIG. 5B shows that the design optimized using the consistently computed analytical sensitivities for external intervening 562i takes advantage of the preloading by designing a mechanism-like structure which pulls down the nodal point 565.

FIG. 5C shows optimization history 565 of the two different optimization methods in the graph 566 which shows the value of the DRESP for $u_{life}$ vs. the number of iterations and in the graph 567 which depicts relative mass constrained at 30% for the iterations. FIG. 5C shows that by performing an optimization in accordance with the principles described herein, the design obtained using consistently computed analytical sensitivities for external intervening compared to the design obtained neglecting derivatives of the external intervening reaches an objective value function which is 71% less, which can be seen as the difference between the lines (i) and (ii) of the graph 566. This significant improvement in objective value is for the same amount of material. Thus, it can be seen that in the example of FIGS. 5A-5C, the resulting optimized topology is constructed in such a way that the preloading is significant in magnitude compared to the life loading. If the optimization algorithm is dealing with the preloading correctly, it should try to benefit from the significant pre-loading. Based upon the deformation patterns shown in FIG. 5B it can be observed that the deformation patterns from the preloading load case to the life load case only change slightly when using consistent and rigorously computed analytical sensitivities for external intervening between two sequential equilibriums, as the methodology correctly determines an optimized structure having a deformation pattern benefiting from the high pre-loading. In contrast, the deformation patterns from the pre-loading case to the life load case change notably for the case of using inconsistent sensitivities as the derivatives of the external intervening are neglected. Such a result for using inconsistent sensitivities is expected as the magnitude of the life loading is small compared to the magnitude of the preloading.

FIG. 5C shows the optimization iteration history 565 for the design obtained using consistently computed analytical sensitivities for external intervening 568i and the design obtained neglecting derivatives of the external intervening 568ii. It can be observed in the graph 566 that the number of optimization iterations for the design obtained using consistently computed analytical sensitivities for external intervening is less than the number of optimization iterations for the design obtained neglecting derivatives of the external intervening. However, the objective optimization history of the displacement $u_{life}$, depicted in the graph 567 is rather flat for the last optimization iterations so this observation will most likely change if the convergence criteria of the optimization workflow used in the optimized procedure, such as the method 660 of FIG. 6 are changed.

Figure 6:
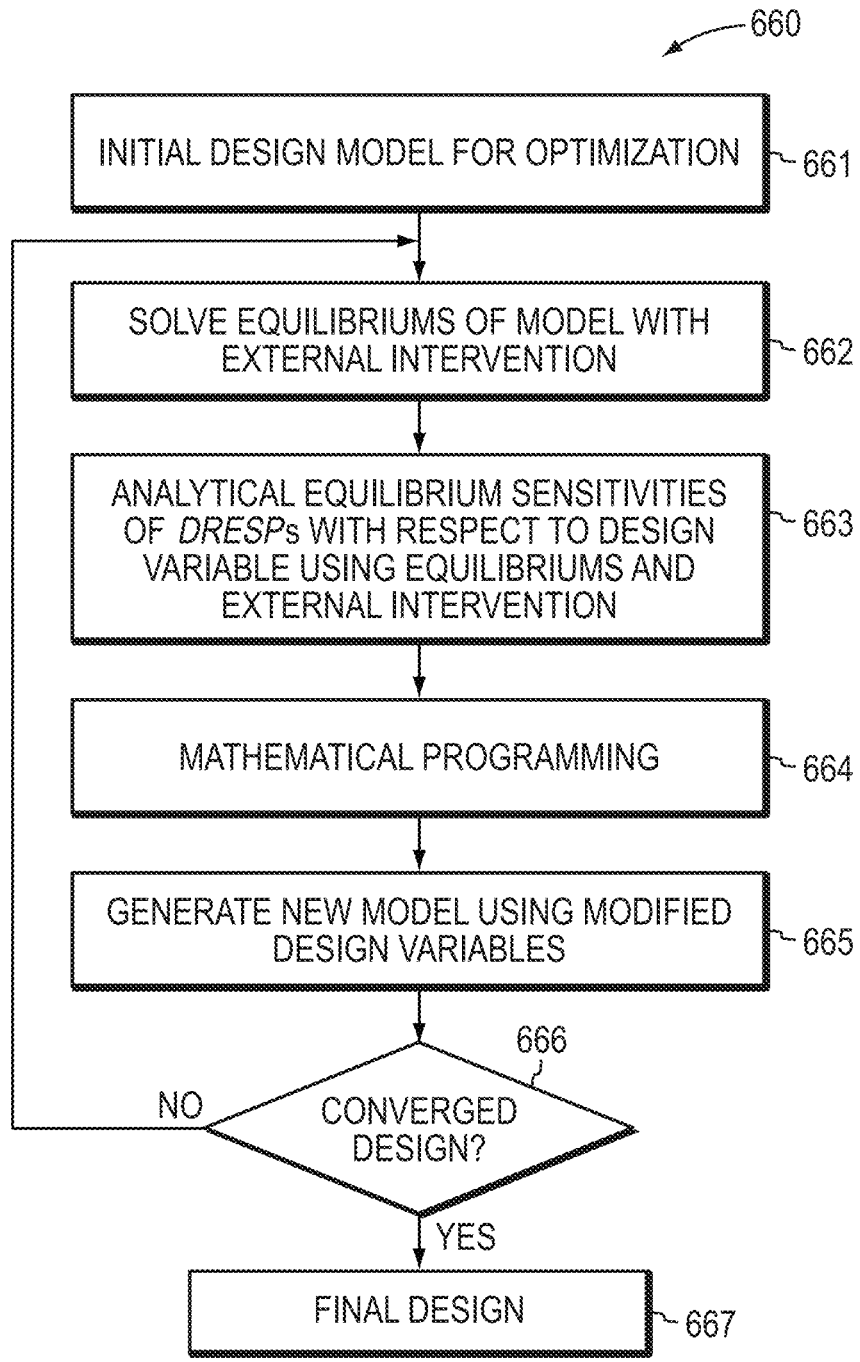
FIG. 6 is flowchart depicting a method of model optimization according to an example embodiment.

FIG. 6 is a flowchart of a method 660 of a characteristic iterative design process based upon sensitivities that incorporates the functionalities of accounting for external intervening as described herein. The method 660 accounts for the consistent analytical sensitivities for external intervening between two sequential equilibriums.

The iterative design process scheme 660 can be implemented, for example, in a predefined workflow of a computer-aided engineering system or implemented using any optimization implementation known in the art. The method 660 begins with a designer creating an initial model for the optimization at step 661 where this initial model includes the various loading and boundary conditions for the equilibriums of the behavior of interest as well as external intervening between the equilibriums. The model defined at step 661 is then subjected to an iterative design process (662-667).

For a given iteration, first, at step 662, the design responses, DRESPs, of the model are determined by solving the equilibriums of the model including the external intervention. The solving at step 662 may be performed using the methods described in steps 203-207 as described hereinabove in relation to FIG. 2. To continue, the method 660 next calculates consistent analytical sensitivities with respect to the design variables for the DRESPs at step 663. The calculations at step 663 may be performed using any of the methods described herein, such as those depicted in FIGS. 4A-4C. A DRESP defines a response for the current analysis model of a given optimization iteration. Thereby, a DRESP extracts one scalar value which can be a direct measure from the model (e.g., mass, center of gravity, etc.) or is determined by the results of the primal solutions for the equilibriums of the model (e.g., stresses, displacements, reaction forces, etc.).

Next, the DRESPs are applied to the model to define an optimization problem consisting of constraints which have to be fulfilled and an objective function to be optimized and the optimization problem is solved using mathematical programming at step 664. According to an embodiment, the mathematical programming is a known optimization solver modified so as to solve the optimization according to the principles described herein where the external intervention is consistently included in the design response sensitivity. In an alternative embodiment of the method 660, the mathematical programming used at step 664 is strictly based upon the values of user defined design targets, DRESPs, and the sensitivities of the DRESPs. Thus, if the sensitivities of the DRESPs are not correct and consistent, then the mathematical programming regularly solves the optimization problem inadequately. Thus, in such an embodiment, it is important that the sensitivities are consistent and correctly determined at step 663 for use in the mathematical programming of step 664.

At step 665 a new physical model for the next optimization iteration is generated based upon the design variables found at step 664. This new model may be automatically generated using principles known to those of skill in the art. Further, according to an embodiment, the design variables determined at step 664 and the physical model variables used at step 665 to generate the new model may be the same, as for example, thickness design variables for sizing optimization, but might also be different as for example, density topology optimization where the design variables are relative densities that are mapped to the physical densities.

Continuing the method 660, it is determined at step 666 if the optimization has converged. If the optimization has not converged, a new optimization cycle is started and the method returns to step 662. If the optimization has converged, the method 660 outputs the final design at step 667. For the converged design, the constraints for the DRESPs should be fulfilled and the objective function should be optimized. If the determined analytical sensitivities at step 663 with external intervention are not consistently derived and implemented then the constraints might not be fulfilled and the objective function not fully optimized.

Figure 7:
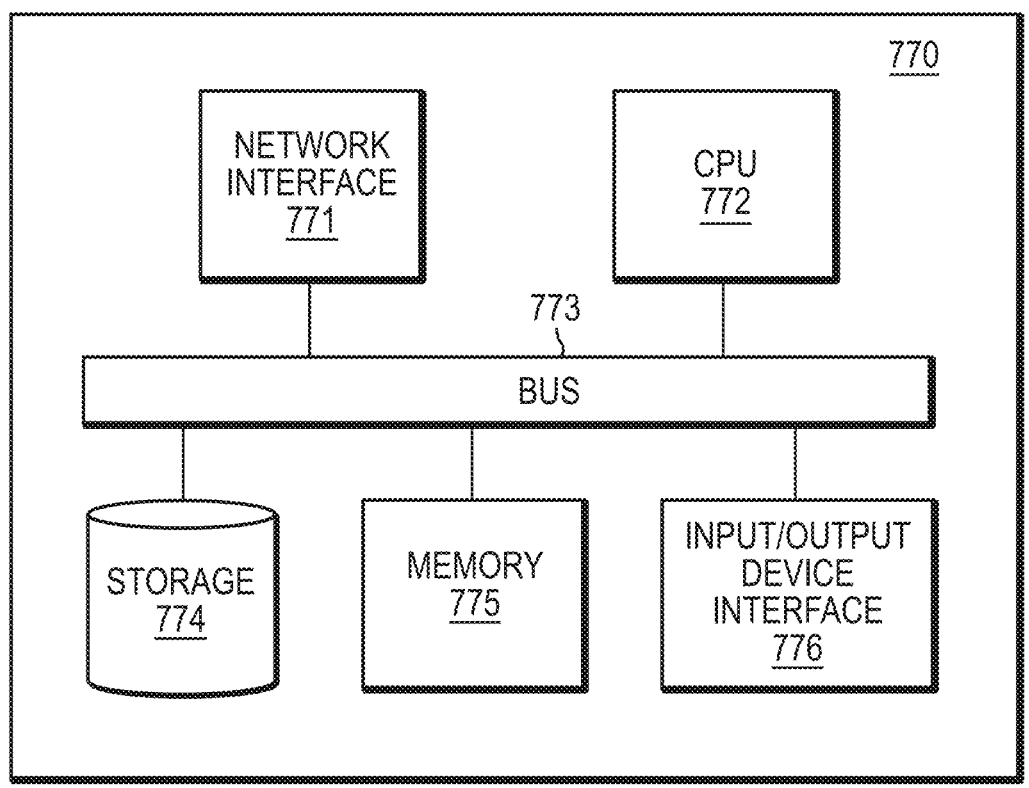
FIG. 7 is a simplified block diagram of a system for optimizing a physical system according to an embodiment of the present invention.

FIG. 7 is a simplified block diagram of a computer-based system 770 that may be used to optimize a physical system according to an embodiment of the present invention. The system 770 comprises a bus 773. The bus 773 serves as an interconnect between the various components of the system 770. Connected to the bus 773 is an input/output device interface 776 for connecting various input and output devices such as a keyboard, mouse, display, speakers, etc. to the system 770. A central processing unit (CPU) 772 is connected to the bus 773 and provides for the execution of computer instructions. Memory 775 provides volatile storage for data used for carrying out computer instructions. Storage 774 provides non-volatile storage for software instructions, such as an operating system (not shown). The system 770 also comprises a network interface 771 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 770, or a computer network environment such as the computer environment 880, described herein below in relation to FIG. 8. The computer system 770 may be transformed into the machines that execute the methods (e.g. 100 and 660) described herein, for example, by loading software instructions into either memory 775 or non-volatile storage 774 for execution by the CPU 772. One of ordinary skill in the art should further understand that the system 770 and its various components may be configured to carry out any embodiments of the present invention described herein. Further, the system 770 may implement the various embodiments described herein utilizing any combination of hardware, software, and firmware modules operatively coupled, internally, or externally, to the system 770.

Figure 8:
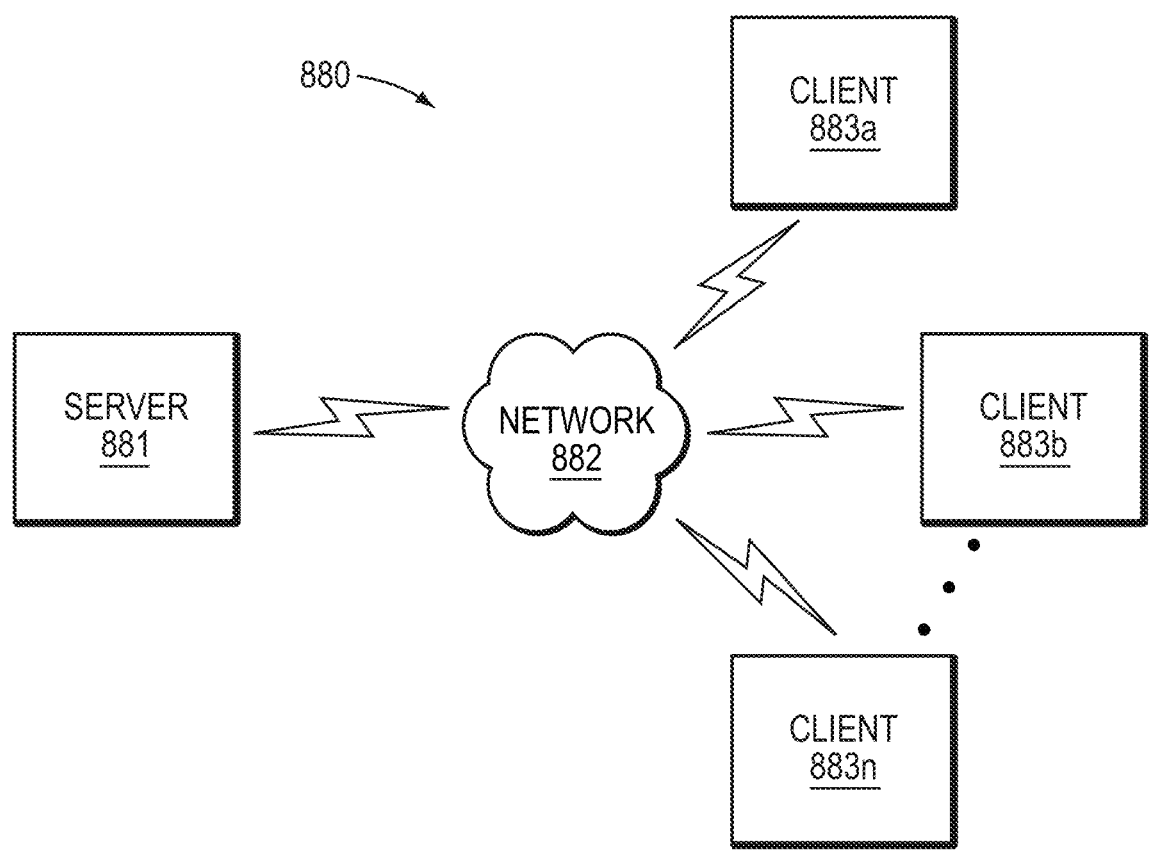
FIG. 8 is a simplified diagram of a computer network environment in which an embodiment of the present invention may be implemented.

FIG. 8 illustrates a computer network environment 880 in which an embodiment of the present invention may be implemented. In the computer network environment 880, the server 881 is linked through the communications network 882 to the clients 883*a-n*. The environment 880 may be used to allow the clients 883*a-n*, alone or in combination with the server 881, to execute any of the methods (e.g., 660) described herein.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of optimizing a real-world physical system, the method comprising:
    defining, in a memory of a processor, a model comprising a plurality of design variables, including loading conditions and boundary conditions for at least a first and a second sequential equilibrium of a behavior of interest in a respective optimization iteration, the defined model representing a real-world physical system where behavior of the defined model is given by an equation stored in the memory, the equation including corresponding sensitivity equations for the plurality of design variables; and
    by the processor, iteratively optimizing the defined model with respect to a first one of the plurality of design variables and a second one of the plurality of design variables using the equation, the optimizing including the processor accounting for a given external intervention event between sequential equilibriums of the respective optimization iteration by:
        (1) adding a term for design response sensitivity of the first one of the plurality of design variables to a corresponding sensitivity equation of the second one of the plurality of design variables, and
        (2) adding a term for design response sensitivity of the second one of the plurality of design variables to a corresponding sensitivity equation of the first one of the plurality of design variables, the processor iteratively optimizing the defined model resulting in an improved optimization of the real-world physical system.

2. The method of claim 1 wherein iteratively optimizing the defined model further comprises:
    modifying the defined model based upon a sensitivity solution of the design response sensitivity of the first one of the plurality of design variables and the second one of the plurality of design variables.

3. The method of claim 2 wherein modifying the defined model comprises:
    modifying at least one of the first one of the plurality of design variables and the second one of the plurality of design variables in a direction indicated by the sensitivity solution of the design response sensitivity.

4. The method of claim 1 wherein the plurality of design variables further include at least one of: a dimension, a thickness, a width, a radius, a composite material angle, a sizing variable, a material interpolation variable for topology, a shape variable, and a bead variable.

5. The method of claim 1 wherein iteratively optimizing the defined model optimizes at least one of: a structural, a computational fluid dynamics (CFD), a thermo-mechanical, an electro-mechanical, an electromagnetic, an acoustic, and a fluid-structural response of the defined model.

6. The method of claim 1 wherein the adding the term for design response sensitivity of the first one of the plurality of design variables and the second one of the plurality of design variables results in consistently including the given external intervention event in the corresponding sensitivity equation of the first one of the plurality of design variables and the second one of the plurality of design variables for the iterative optimizing.

7. The method of claim 1 wherein adding the term for design response sensitivity of the first one of the plurality of design variables and the second one of the plurality of design variables is performed using an adjoint or a direct method.

8. The method of claim 1 wherein the iteratively optimizing determines a parameter value for the first one of the plurality of design variables and the second one of the plurality of design variables.

9. A system for optimizing a real-world physical system, the system comprising:
    a processor; and
    a memory with computer code instructions stored thereon, the processor and the memory with the computer code instructions being configured to cause the system to:
    define, in the memory, a model comprising a plurality of design variables, including loading conditions and boundary conditions for at least a first and a second sequential equilibrium of a behavior of interest in a respective optimization iteration, the defined model representing the real-world physical system where behavior of the defined model is given by an equation stored in the memory, the equation including corresponding sensitivity equations for the plurality of design variables; and
    by the processor, iteratively optimize the defined model with respect to a first one of the plurality of design variables and a second one of the plurality of design variables using the equation, the optimizing including the processor accounting for a given external intervention event between sequential equilibriums of the respective optimization iteration by:
(1) adding a term for design response sensitivity of the first one of the plurality of design variables to a corresponding sensitivity equation of the second one of the plurality of design variables, and
(2) adding a term for design response sensitivity of the second one of the plurality of design variables to a corresponding sensitivity equation of the first one of the plurality of design variables, the processor iteratively optimizing the defined model resulting in an improved optimization of the real-world physical system.

10. The system of claim 9 wherein the processor and the memory with the computer code instructions are further configured to cause the system to:
modify the defined model based upon a sensitivity solution of the design response sensitivity of the first one of the plurality of design variables and the second one of the plurality of design variables.

11. The system of claim 10 wherein the processor and the memory with the computer code instructions are further configured to cause the system to:
modify the first one of the plurality of design variables and the second one of the plurality of design variables in a direction indicated by the sensitivity solution of the design response sensitivity.

12. The system of claim 9 wherein the plurality of design variables further include at least one of: a dimension, a thickness, a width, a radius, a composite material angle, a sizing variable, a material interpolation variable for topology, a shape variable, and a bead variable.

13. The system of claim 9 wherein iteratively optimizing the defined model optimizes at least one of: a structural, a computational fluid dynamics (CFD), a thermo-mechanical, an electro-mechanical, an electromagnetic, an acoustic, and a fluid-structural response of the defined model.

14. The system of claim 9 wherein the adding the term for design response sensitivity of the first one of the plurality of design variables and the second one of the plurality of design variables results in consistently including the given external intervention event in the corresponding sensitivity equation of the first one of the plurality of design variables and the second one of the plurality of design variables for the iterative optimizing.

15. The system of claim 9 wherein adding the term for design response sensitivity of the first one of the plurality of design variables and the second one of the plurality of design variables is performed using an adjoint or a direct method.

16. The system of claim 9 wherein the iteratively optimizing determines a parameter value for the first one of the plurality of design variables and the second one of the plurality of design variables.

17. A non-transitory computer program product for optimizing a real-world physical system, the non-transitory computer program product executed by a server in communication across a network with one or more clients and comprising:
a computer readable medium, the computer readable medium comprising program instructions which, when executed by a processor, causes the processor to:
define, in memory of the processor, a model comprising a plurality of design variables, including loading conditions and boundary conditions for at least a first and a second sequential equilibrium of a behavior of interest in a respective optimization iteration, the defined model representing the real-world physical system where behavior of the defined model is given by an equation stored in the memory, the equation including corresponding sensitivity equations for the plurality of design variables; and
iteratively optimize the defined model with respect to a first one of the plurality of design variables and a second one of the plurality of design variables using the equation, the optimizing including the processor accounting for a given external intervention event between sequential equilibriums of the respective optimization iteration by:
(1) adding a term for design response sensitivity of the first one of the plurality of design variables to a corresponding sensitivity equation of the second one of the plurality of design variables, and
(2) adding a term for design response sensitivity of the second one of the plurality of design variables to a corresponding sensitivity equation of the first one of the plurality of design variables, the processor iteratively optimizing the defined model resulting in an improved optimization of the real-world physical system.

* * * * *